US006996193B2

(12) United States Patent
Yamagata et al.

(10) Patent No.: US 6,996,193 B2
(45) Date of Patent: Feb. 7, 2006

(54) TIMING ERROR DETECTION CIRCUIT, DEMODULATION CIRCUIT AND METHODS THEREOF

(75) Inventors: Taku Yamagata, Kanagawa (JP); Shunji Maeda, Tokyo (JP)

(73) Assignee: Sony Corporation, Tokyo (JP)

( * ) Notice: Subject to any disclaimer, the term of this patent is extended or adjusted under 35 U.S.C. 154(b) by 956 days.

(21) Appl. No.: 09/771,743

(22) Filed: Jan. 29, 2001

(65) Prior Publication Data

US 2001/0017902 A1 Aug. 30, 2001

(30) Foreign Application Priority Data

Jan. 31, 2000 (JP) .......................... P2000-027365

(51) Int. Cl.
*H04L 27/22* (2006.01)

(52) U.S. Cl. ...................... 375/329; 375/354; 375/355; 375/227; 375/293; 348/537; 348/607; 329/304

(58) Field of Classification Search ............... 375/354, 375/355, 227, 293; 348/537, 607; 329/304
See application file for complete search history.

(56) References Cited

U.S. PATENT DOCUMENTS 5,122,758 A * 6/1992 Tomita ........................ 329/304
RE34,206 E * 3/1993 Sayar .......................... 375/293
5,235,622 A * 8/1993 Yoshida ....................... 375/355
5,243,630 A * 9/1993 Rhebergen .................. 375/355
5,343,502 A * 8/1994 Sato ............................ 375/354
6,097,444 A * 8/2000 Nakano ....................... 348/607
6,583,822 B1 * 6/2003 Jun ............................ 348/537
6,587,503 B1 * 7/2003 Takeuchi et al. ............ 375/227

FOREIGN PATENT DOCUMENTS

JP 10-229423 * 8/1998

OTHER PUBLICATIONS

JP-03-188736(Abstract Only); Hideho T.; Timing Extraction System;Aug. 1991.*
JP 10-229423 (English Language Translation); Fujimura et al.; Timing Regeneration Circuit and Demodulator using the same.*

* cited by examiner

*Primary Examiner*—Stephen Chin
*Assistant Examiner*—Sudhanshu C. Pathak
(74) *Attorney, Agent, or Firm*—Frommer Lawrence & Haug LLP; William S. Frommer

(57) ABSTRACT

A timing error detection circuit capable of detecting a timing error of symbols in a signal with a simple and small-sized configuration, comprising a sampling circuit for sampling a signal including symbols arranged at a predetermined symbol cycle at a frequency equal to four times of a symbol rate, an amplitude detection circuit for detecting an amplitude of a position subjected to said sampling in said signal, a difference detection circuit for detecting a timing error indicating deviation of the symbol included in the signal from a conceivable timing based on difference of said detected plurality of amplitudes, and a timing error signal generation circuit.

16 Claims, 10 Drawing Sheets

1
RECEIVING SIGNAL
S100
2
SYMBOL TIMING
REPRODUCTION
CIRCUIT
S2
102
CARRIER
REPRODUCTION
CIRCUIT
S102
103
SYMBOL
DECODE
CIRCUIT
S103

2 SYMBOL TIMING REPRODUCTION CIRCUIT
SIGNAL S2
TIMING ERROR DETECTION CIRCUIT
13
S13
LOOP FILTER CIRCUIT
12
S12
INTERPOLATION CIRCUIT
10
S11
SAMPLE TIMING GENERATION CIRCUIT
11
RECEIVING SIGNAL S100

□ SYMBOL OF S2

○ SAMPLING POSITION IN TIMING ERROR DETECTION CIRCUIT

2 SYMBOL TIMING GENERATION CIRCUIT
SIGNAL S2
RECEIVING SIGNAL S100
INTERPOLATION CIRCUIT
10
S11
SAMPLE TIMING GENERATION CIRCUIT
11
S12
LOOP FILTER CIRCUIT
12
S13
TIMING ERROR DETECTION CIRCUIT
33

□ SYMBOL OF S2
○ SAMPLING POSITION IN TIMING ERROR DETECTION CIRCUIT
△ DATA OBTAINED BY INTERPOLATION PROCESSING

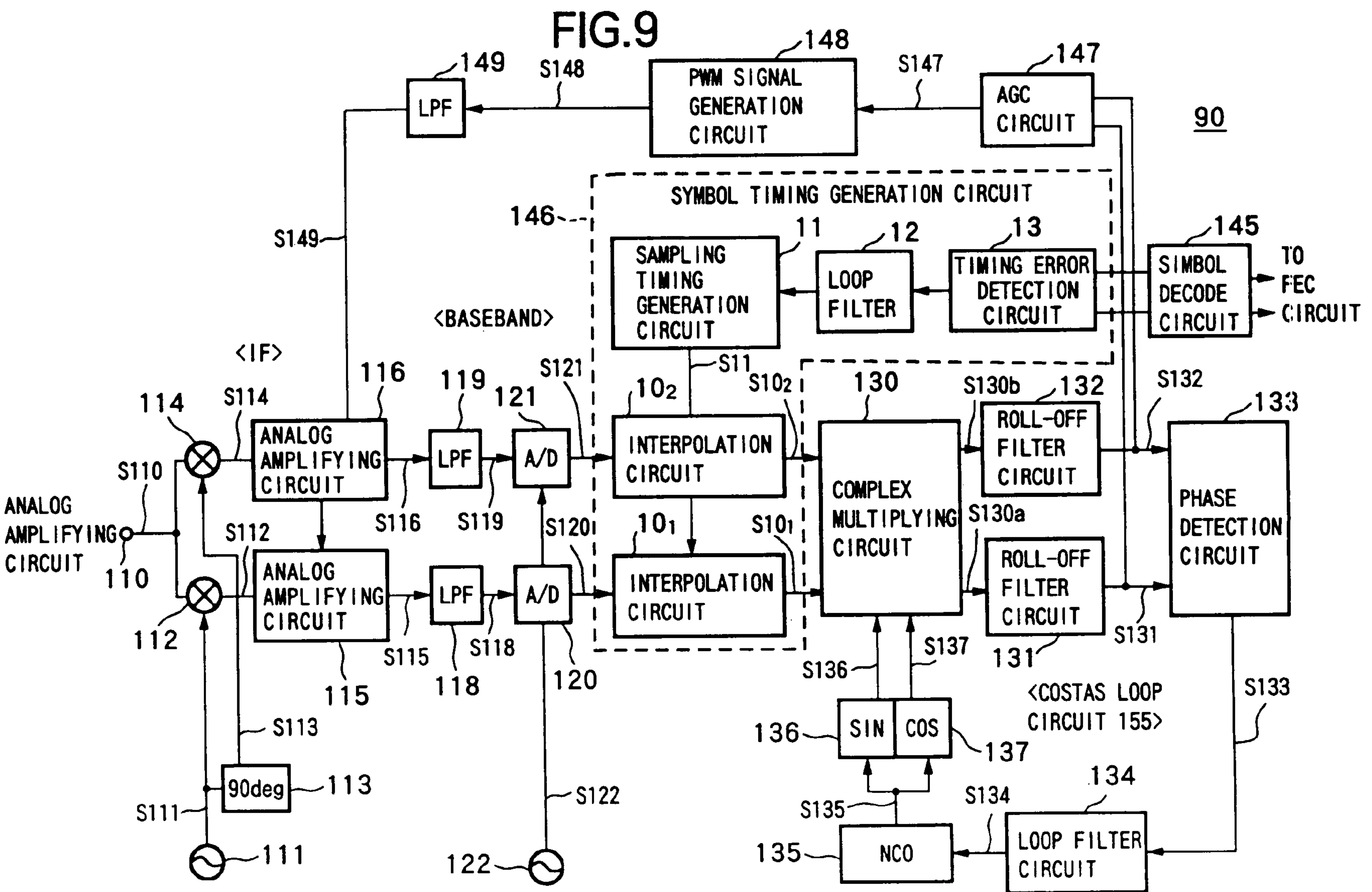
FIG.9
90
ANALOG AMPLIFYING CIRCUIT
110
S110
114
112
S111
111
90deg
113
S113
S112
S114
<IF>
ANALOG AMPLIFYING CIRCUIT
116
ANALOG AMPLIFYING CIRCUIT
115
S149
LPF
149
S148
PWM SIGNAL GENERATION CIRCUIT
148
S147
AGC CIRCUIT
147
S116
S115
LPF
119
LPF
118
S119
S118
<BASEBAND>
A/D
121
A/D
120
S121
S120
S122
122
146
SYMBOL TIMING GENERATION CIRCUIT
SAMPLING TIMING GENERATION CIRCUIT
11
S11
LOOP FILTER
12
TIMING ERROR DETECTION CIRCUIT
13
INTERPOLATION CIRCUIT
$10_2$
INTERPOLATION CIRCUIT
$10_1$
$S10_2$
$S10_1$
COMPLEX MULTIPLYING CIRCUIT
130
S130b
S130a
ROLL-OFF FILTER CIRCUIT
132
ROLL-OFF FILTER CIRCUIT
131
S132
S131
PHASE DETECTION CIRCUIT
133
S133
SIMBOL DECODE CIRCUIT
145
TO FEC CIRCUIT
<COSTAS LOOP CIRCUIT 155>
LOOP FILTER CIRCUIT
134
S134
SIN
136
COS
137
S136
S137
NCO
135
S135

Related Art

TIMING ERROR DETECTION CIRCUIT, DEMODULATION CIRCUIT AND METHODS THEREOF

BACKGROUND OF THE INVENTION

1. Field of the Invention

The present invention relates to a timing error detection circuit for detecting a timing error of symbols in a signal, a demodulation circuit for reproducing a symbol timing based on the detected timing error and methods thereof.

2. Description of the Related Art

In a radio communication system, modulation for putting a signal (information) on a carrier is performed on a sending side and demodulation for taking out the signal on the carrier is performed on a receiving side.

Among a variety of modulation methods, there is a phase shift keying (PSK) modulation as a format used for example for satellite broadcasting.

A modulation signal S(t) subjected to the PSK modulation is expressed by a formula (1) below.

$$S(t)=\exp(j\theta(t))\cdot\exp(j\omega t) \quad (1)$$

In the above formula (1), θ(t) indicates a signal (information) converted to a phase and ω indicates a carrier frequency.

In a receiving apparatus, θ(t) is taken out from a modulation signal S(t) and subjected to demodulation for converting into a signal with meaning.

FIG. 10 is a view of the configuration of a demodulation circuit 100 in the receiving apparatus.

As shown in FIG. 10, the demodulation circuit 100 comprises a symbol timing reproduction circuit 101, a carrier reproduction circuit 102 and a symbol decode circuit 103.

The symbol timing reproduction circuit 101 is also called a clock reproduction circuit and used for correctly sampling data by an assumed clock in the demodulation circuit. Generally, a block generating a clock is not capable of generating a clock signal of strictly absolute cycle due to various factors. Therefore, it is necessary to detect a difference of the clock presumed in advance and an actual clock and to generate an accurate clock by feeding-back. The symbol timing reproduction circuit 101 corresponds to the feedback circuit.

The symbol timing reproduction circuit 101 carries out clock reproduction of a receiving signal S100 and outputs the result as a signal S101 to the carrier reproduction circuit 102.

A variety of circuits have been proposed as the symbol timing circuit 101 as such.

For example, the Japanese Unexamined Patent Publication No. 9-28597 discloses a symbol timing reproduction circuit capable of generating a phase signal and having high resistence against residual carrier by using the phase signal.

The carrier reproduction circuit 102 performs processing of removing carrier components from the signal S101.

Namely, the carrier reproduction circuit 102 performs canceling/erasing exp(jωt) as carrier components in the above formula (1) from the signal S101. Specifically, the carrier reproduction circuit 102 multiplies the signal S101 with a signal indicating exp(−jωt).

The symbol decode circuit 103 receives as an input the signal S102 corresponding to exp(jθ(t)) shown in the above formula (1) from the carrier reproduction circuit 102 and performs decode processing for converting by using a correspondence table of θ and the data.

However, in the symbol timing reproduction circuit disclosed in the above Japanese Unexamined Patent Publication No. 9-28597, since it is necessary to generate a phase signal, a ROM table for generating a phase signal, etc. has to be prepared, thus, there is a disadvantage that the circuit becomes complex and large in scale.

SUMMARY OF THE INVENTION

An object of the present invention is to provide a timing error detection circuit capable of detecting a timing error of a symbol in a signal with a simple and small-scaled configuration and the method, a demodulation apparatus using the timing error detection circuit and the method.

To attain the above object, a first aspect of the present invention there is provided a timing error detection circuit for detecting a timing error of symbols arranged at a predetermined symbol cycle included in a signal, comprising a sampling circuit for sampling the signal at a frequency equal to or more than double of a symbol rate; an amplitude detection circuit for detecting an amplitude at the sampled position in the signal; and a detection circuit for detecting the timing error based on difference of the detected plurality of amplitudes.

An operation of the timing error detection circuit according to the first aspect of the present invention is as follows.

A signal including a symbol arranged at a predetermined symbol cycle is sampled at a frequency double of the symbol rate in the sampling circuit.

Next, in the amplitude detection circuit, an amplitude of the position sampled in the signal is detected.

Then in the detection circuit, the timing error is detected based on the difference of the detected plurality of amplitudes.

As explained above, in the timing detection circuit according to the first aspect of the present invention, a timing of a symbol can be detected based on the amplitude without using a phase signal.

Therefore, a timing error of a symbol can be detected with a simple and small-scaled configuration, while a stable and high speed synchronization can be realized for a signal wherein carrier components remain.

Also, according to the second aspect of the present invention, t here os provided a timing error detection circuit for detecting a timing error of symbols arranged at a predetermined symbol cycle T included in a signal, comprising a sampling circuit for sampling the signal at a frequency equal to four times of a symbol rate; an amplitude detection circuit for detecting an amplitude at the sampled position in the signal; and a detection circuit for detecting a direction and size of the timing error based on the large or small relationship and the difference of the detected amplitude at time “T/4” and the detected amplitude at time “3T/4” when assuming a symbol appears at times “0” and “T”.

An operation of the timing error detection circuit according to the second aspect of the present invention is as follows.

In the sampling circuit, a signal including a symbol arranged at a predetermined symbol cycle T is sampled at four times a frequency of the symbol rate.

Next, in the amplitude detection circuit, an amplitude at a sampled position in the signal is detected.

Then, in the detection circuit, assuming the time when a presumed symbol appears at times “0” and “T”, the direction and size of the timing error are detected based on the size and difference between the detected amplitude at time “T/4” and the detected amplitude at time “3T/4”.

According to a third aspect of the present invention, there is provided a timing error detection circuit for detecting a timing error of symbols arranged at a predetermined symbol cycle T included in a signal, comprising a sampling circuit for sampling at a frequency twice a symbol rate; an interpolation circuit for generating data at time "T/4" by using sampled data at time "0" and "T/2", and generating data at time "3T/4" by using the sampled data at time "T/2" and data on time "T" when assuming a symbol appears at times "0" and "T" an amplitude detection circuit for detecting an amplitude of the signal at the position from data at the time "T/4" and time "3T/4"; and a detection circuit for detecting a direction and amount of the timing error based on the large or small relationship and the difference of the amplitude at the time "T/4" and the amplitude at the time "3T/4".

An operation of a timing error detection circuit according to the third aspect of the present invention is as described below.

In a sampling circuit, a signal including symbols arranged at a predetermined symbol cycle is sampled at a frequency equal to double of a symbol rate.

Next, in an interpolation circuit, data at time "T/4" is generated by using the sampled data at time "0" and data at time "T/2", and data at time "3T/4" is generated by using the sampled data at time "T/2" and data at time "T".

Then, in an amplitude detection circuit, an amplitude of the signal at the position is detected from the data at time "T/4" and data at "3T/4". Then in a detection circuit, a direction and amount of the timing error are detected based on the size and difference between the amplitude at time "T/2" and amplitude at time "3T/4".

Furthermore, according to the first aspect of the present invention, there is provided a demodulation circuit, comprising a symbol timing reproduction circuit for detecting a timing error of symbols arranged at a predetermined symbol cycle included in a signal and reproducing a symbol timing of the signal based on the detected timing error; a carrier reproduction circuit for performing carrier reproduction of the signal wherein the symbol timing is reproduced; and a symbol decode circuit for decoding the symbol included in the carrier reproduced signal; and wherein the symbol timing reproduction circuit comprises a sampling circuit for sampling the signal at a frequency equal to or more than double of a symbol rate or more; an amplitude detection circuit for detecting an amplitude at the sampled position in the signal; a detection circuit for detecting the timing error based on difference of the detected plurality of amplitudes; and an interpolation circuit for reproducing the symbol timing by performing interpolation processing on the signal based on the detected timing error.

An operation of the demodulation circuit according to the first aspect of the present invention is as below.

In the symbol timing reproduction circuit, a timing error of symbols is detected by the same operation as in the timing error detection circuit of the first aspect explained above, and a symbol timing is reproduced by performing interpolation processing on the signal based on the detected timing error.

Then, in the carrier reproduction circuit, carrier reproduction is performed for the signal wherein the symbol timing is reproduced.

Next, in the symbol decode circuit, the symbol included in the carrier reproduced signal is decoded.

Also, according to the second aspect of the present invention, there is provided a demodulation circuit, comprising a symbol timing reproduction circuit for detecting a timing error of symbols arranged at a predetermined symbol cycle included in a signal and reproducing a symbol timing of the signal based on the detected timing error; a carrier reproduction circuit for performing carrier reproduction of the signal wherein the symbol timing is reproduced; and a symbol decode circuit for decoding the symbol included in the carrier reproduced signal; and wherein the symbol timing reproduction circuit comprises a sampling circuit for sampling the signal at a frequency equal to four times of a symbol rate; an amplitude detection circuit for detecting an amplitude at the sampled position in the signal; a detection circuit for detecting a direction and size of the timing error based on sizes and difference of the detected amplitude at time "T/4" and the detected amplitude at time "3T/4" when assuming a symbol appears at times "0" and "T"; and an interpolation circuit for reproducing the symbol timing by performing interpolation processing on the signal based on the detected timing error.

The demodulation circuit according to the second aspect of the present invention is as below.

In the symbol timing reproduction circuit, a timing error of symbols is detected by the same operation as in the timing error detection circuit of the second aspect explained above, and a symbol timing is reproduced by performing interpolation processing on the signal based on the detected timing error.

Next, in the carrier reproduction circuit, carrier reproduction is performed for a signal wherein the symbol timing is reproduced.

Then, in the symbol decode circuit, the symbol included in the carrier reproduced signal is decoded.

According to a third aspect of the present invention, there is provided a demodulation circuit, comprising a symbol timing reproduction circuit for detecting a timing error of symbols arranged at a predetermined symbol cycle included in a signal and reproducing a symbol a symbol timing of the signal based on the detected timing error; a carrier reproduction circuit for performing carrier reproduction of the signal wherein the symbol timing was reproduced; and symbol decode circuit for decoding the symbol included in the carrier reproduced signal; and wherein the symbol timing reproduction circuit comprises a sampling circuit for sampling the signal at a frequency equal to double of a symbol rate; a first interpolation circuit for generating data at time "T/4" by using the sampled data at time "0" and "T/2", and generating data at time "3T/4" by using the sampled data at time "T/2" and data at time "T" when assuming a symbol appears at times "0" and "T"; an amplitude detection circuit for detecting an amplitude of the signal at the position from data on the time "T/4" and data at the time "3T/4"; a detection circuit for detecting a direction and amount of the timing error based on the large or small relationship and the difference of an amplitude at the time "T/4" and an amplitude at the time "3T/4"; and a second interpolation circuit for reproducing a symbol timing by performing interpolation processing on the signal based on the detected timing error.

The demodulation circuit according to the third aspect of the present invention is as below.

In the symbol timing reproduction circuit, a timing error of symbols is detected by the same operation as in the timing error detection circuit of the third aspect explained above, and a symbol timing is reproduced by performing interpolation processing on the signal based on the detected timing error.

Next, in the carrier reproduction circuit, carrier reproduction is performed for a signal wherein the symbol timing is reproduced.

Then, in the symbol decode circuit, the symbol included in the carrier reproduced signal is decoded.

According to the first aspect of the present invention, there is provided a timing error detection method for detecting a timing error of symbols arranged at a predetermined symbol cycle included in a signal, comprising the steps of sampling the signal at a frequency equal or more than double of a symbol rate or more; detecting an amplitude at the sampled position in the signal; and detecting the timing error based on difference of the detected plurality of amplitudes.

Also, according to the second aspect of the present invention, there is provided a timing error detection method for detecting a timing error of symbols arranged at a predetermined symbol cycle T included in a signal, including the steps of sampling the signal at a frequency of four times a symbol rate; detecting an amplitude at the sampled position in the signal; an detecting a direction and amount of the timing error based on amount and difference of the detected amplitude at time "T/4" and the detected amplitude at time "3T/4" when assuming a symbol appears at times "0" and "T".

Also, according to the third aspect of the present invention, there is provided a timing error detection method for detecting a timing error of symbols arranged at a predetermined symbol cycle T included in a signal, including the steps of sampling at a frequency equal to double of a symbol rate; generating data at time "T/4" by using the sampled data at time "0" and data at time "T/2" when assuming a symbol appears at times "0" and "T"; generating data at time "3T/4" by using the sampled data at time "T/2" and data on time "T"; detecting an amplitude of the signal at the position from data at the time "T/4" and time "3T/4"; and detecting a direction and amount of the timing error based on the large or small relationship and the difference of the amplitude at the time "T/4" and the amplitude at the time "3T/4".

According to the first aspect of the present invention, there is provided a modulation method including the steps of sampling the signal at a frequency equal to double of twice a symbol rate or more; detecting an amplitude at the sampled position in the signal; detecting the timing error based on difference of the detected plurality of amplitudes; reproducing a symbol timing by performing interpolation processing on the signal based on the detected timing error; performing carrier reproduction of the signal wherein the symbol timing is reproduced; and decoding the symbol included in the carrier reproduced signal.

According to the second aspect of the present invention, there is provided a demodulation method, including the steps of sampling the signal including symbols arranged at a predetermined symbol cycle at a frequency equal to four times of a symbol rate; detecting an amplitude at the sampled position in the signal; detecting a direction and amount of the timing error based on the large or small relationship and the difference of the detected amplitude at time "T/4" and the detected amplitude at time "3T/4" when assuming a symbol appears at times "0" and "T"; reproducing a symbol timing by performing interpolation processing on the signal based on the detected timing error; performing carrier reproduction of the signal wherein the symbol timing is reproduced; and decoding the symbol included in the carrier reproduced signal.

According to the second aspect of the present invention, there is provided a demodulation method including the steps of sampling a signal including symbols arranged at a predetermined symbol cycle at a frequency equal to double of a symbol rate; generating data at time "T/4" by using the sampled data at time "0" and data at time "T/2" when assuming a symbol appears at times "0" and "T"; generating data at time "3T/4" by using the sampled data at time "T/2" and data at time "T"; detecting an amplitude of the signal at the position from data at the time "T/4" and data at time "3T/4"; and detecting a direction and amount of the timing error based on amount and difference of the amplitude of the time "T/4" and the amplitude at the time "3T/4"; reproducing the symbol timing by performing interpolation processing on the signal based on the detected timing error; performing carrier reproduction of the signal wherein the symbol timing is reproduced; and decoding the symbol included in the carrier reproduced signal.

In the timing error detection circuit and the method, demodulation apparatus and the method of the present invention as explained above, specifically, the signal is subjected to phase shift modulation.

BRIEF DESCRIPTION OF THE DRAWINGS

These and other objects and features of the present invention will become clearer from the following description of the preferred embodiments given with reference to the accompanying drawings, in which:

FIG. 9 is a view of the configuration of a receiving apparatus according to a third embodiment of the present invention.

DESCRIPTION OF THE PREFERRED EMBODIMENTS

Below, preferred embodiments will be described with reference to the accompanying drawings.

Figure 1:
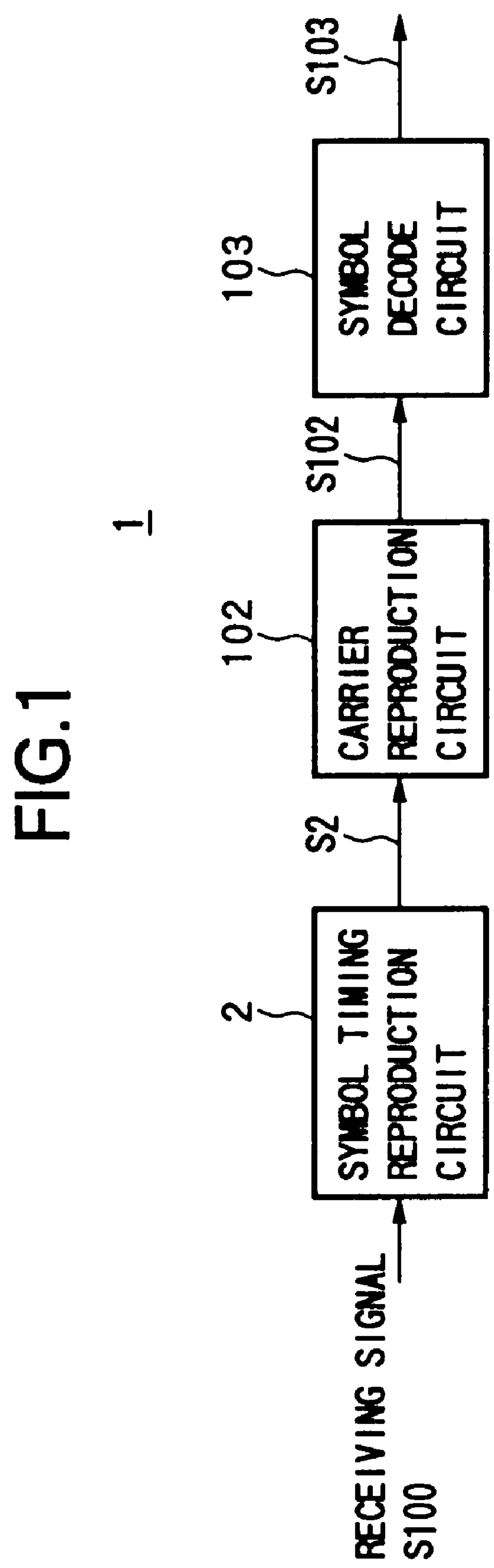
FIG. 1 is a view of the configuration of a demodulation circuit according to a first embodiment of the present invention.

FIG. 1 is a view of the configuration of a demodulation circuit 1 of the present embodiment.

As shown in FIG. 1, the demodulation circuit 1 comprises, for example, a symbol timing reproduction circuit 2, a carrier reproduction circuit 102 and a symbol decode circuit 103.

Figure 10:
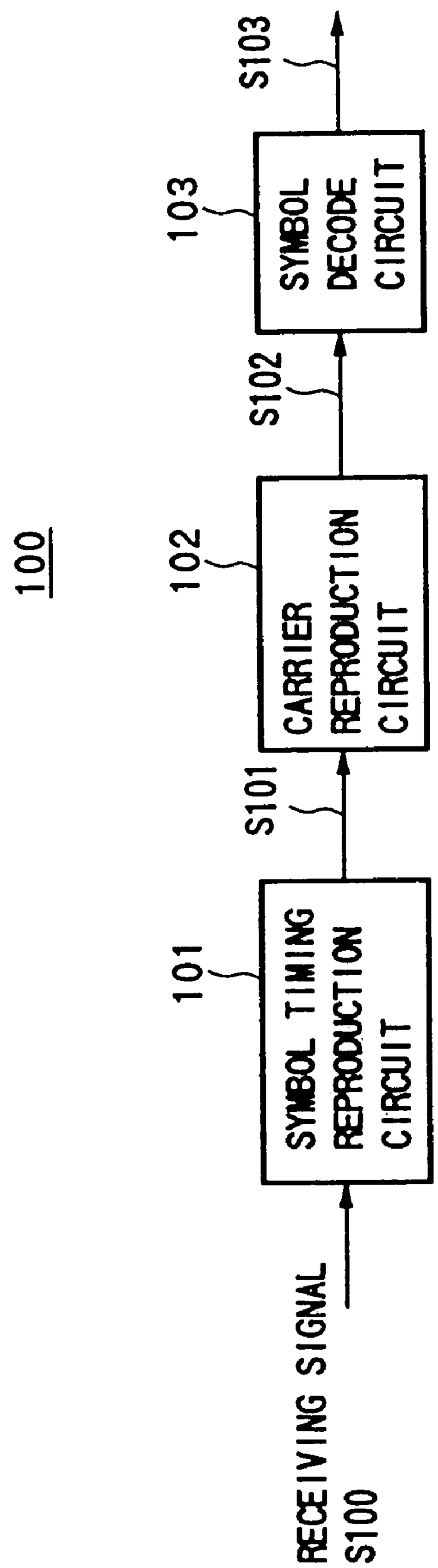
FIG. 10 is a view of the configuration of a demodulation circuit of the related art.

Here, the carrier reproduction circuit 102 and the symbol decode circuit 103 are the same with those having the same reference numbers in the above mentioned demodulation circuit 100 of the related art in FIG. 10.

The demodulation circuit 1 corresponds to a demodulation circuit of claims 7 and 9, wherein the symbol timing reproduction circuit 2 corresponds to the symbol timing reproduction circuit of the present invention, the carrier reproduction circuit 102 corresponds to the carrier reproduction circuit of the present invention and the symbol decode circuit 103 corresponds to the symbol decode circuit of the present invention.

Below, the symbol timing reproduction circuit 2 will be explained in detail.

Figure 2:
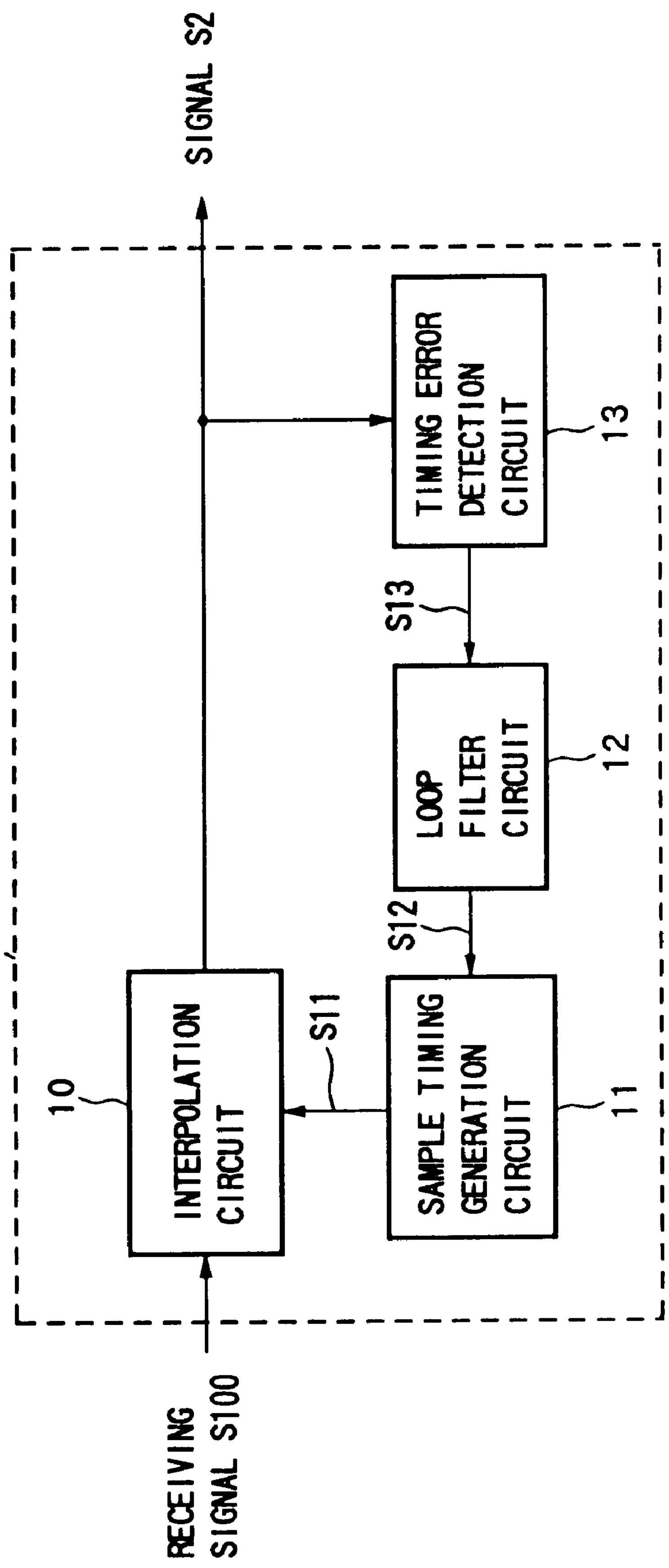
FIG. 2 is a view of the configuration of a symbol timing reproduction circuit in FIG. 1.

FIG. 2 is a view of the configuration of the symbol timing reproduction circuit 2.

As shown in FIG. 2, the symbol timing reproduction circuit 2 comprises an interpolation circuit 10, a sampling timing determination circuit 11, a loop filter circuit 12 and a timing error detection circuit 13.

The interpolation circuit 10 generates a receiving signal S2 by sampling a receiving signal S100 at a timing indicated by a sampling timing determination signal S11 from the sampling timing determination circuit 11 and output the same to the carrier reproduction circuit 102 shown in FIG. 1.

Here, the receiving signal S100 is a signal subjected to phase shift modulation, such as BPSK and QPSK.

At this time, the receiving signal S100 input to the interpolation circuit 10 is a signal obtained by performing station selecting processing and A/D conversion processing by a tuner on a receiving signal of a parabolic antenna.

The sample timing determination circuit 11 determines a new sample timing so as to eliminate or control a timing error detected in the timing error detection circuit 13 based on a timing error signal S12 received as an input from the loop filter circuit 12 and outputs a sample timing determination signal S11 indicating the determined sample timing.

The loop filter circuit 12 generates a timing error signal S12 by removing noise components from the timing error signal S13 received as an input from the timing error detection circuit 13 and outputs the same to the sample timing determination circuit 11.

The timing error detection circuit 13 judges, for example, whether or not the signal S2 from the interpolation circuit 10 is sampled at a clock cycle and timing presumed in advance.

Specifically, the timing error detection circuit 13 detects an amount and direction of deviation between a sample timing of the signal S2 and a presumed sample timing, generates a timing error signal S13 indicating the two and outputs the same to the loop filter circuit 12.

Below, a method of generating a timing error S13 in the timing error detection circuit 13 will be explained.

Figure 3A:
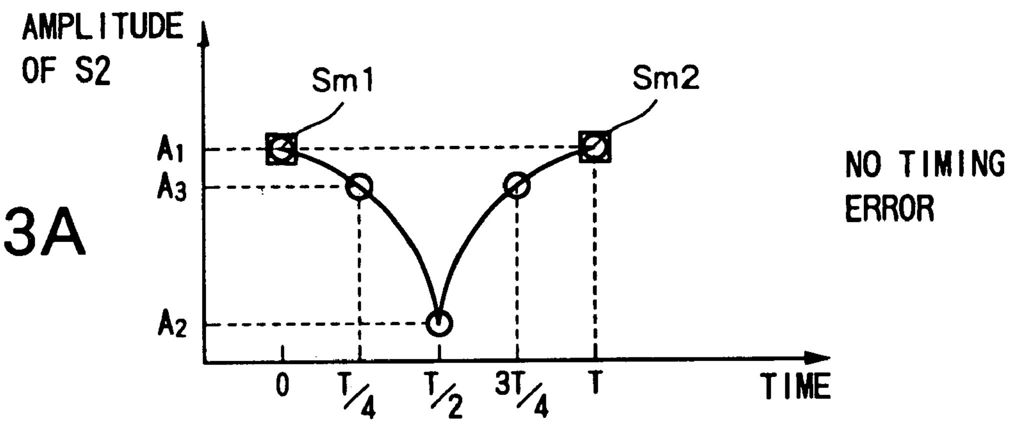
FIGS. 3A to 3C are views for explaining processing of the timing error detection circuit in FIG. 2.
Figure 3B:
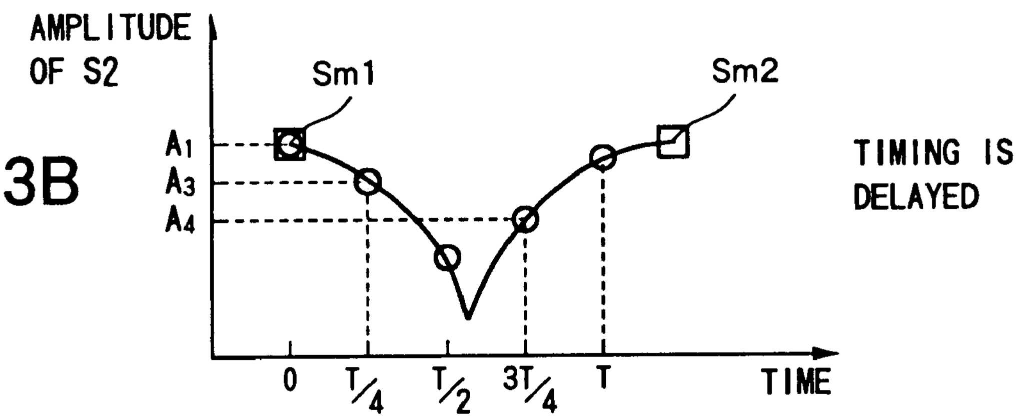
Figure 3C:
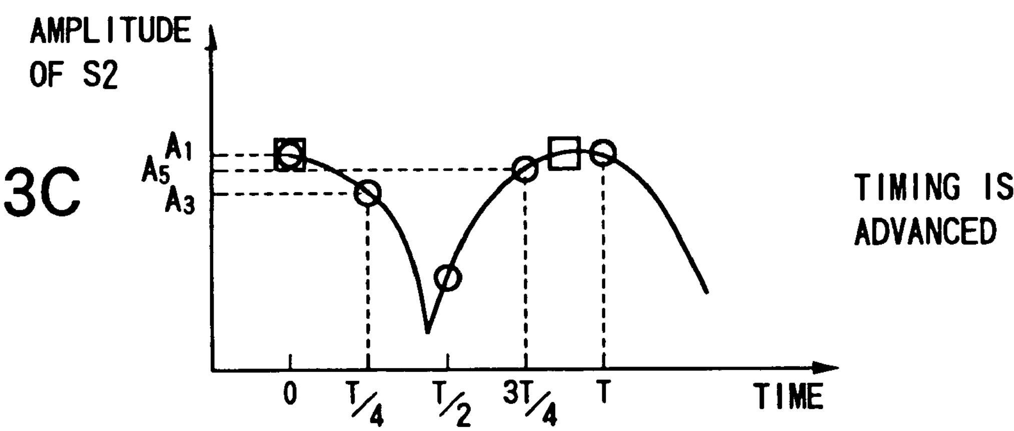

FIGS. 3A to 3C are views of the relationship of an amplitude and time of the signal S2, wherein FIG. 3A is a view when no timing deviation arose in a symbol in the signal S2, FIG. 3B is a view when a timing of the symbol in the signal S2 delays with respect to a presumed sample timing, and FIG. 3C is a view when the timing of the symbol is advanced with respect to the presumed sample timing.

In FIGS. 3A to 3C, "T" indicates a symbol cycle.

Here, the signal S2 is modulated in a PSK format wherein a signal (information) is put on a carrier phase, thus, the amplitude becomes constant at the symbol point. Also, the amplitude of the signal S2 depends on a phase change pattern and the amplitude becomes smaller as becoming distant from the symbol point between symbols and becomes minimum near the mid-point of adjacent symbols.

Accordingly, when there is no timing deviation in the symbol in the signal S2, as shown in FIG. 3A, assuming that times when symbols Sm1 and Sm2 position are "0" and "T", an amplitude of the signal S2 becomes approximately the same maximum value $A_1$ at the times "0" and "T" and becomes the minimum $A_2$ at their mid-point time "T/2".

Also, in the case shown in FIG. 3A, the amplitude of the signal S2 becomes the same $A_3$ at times "T/4" and "3T/4".

Also, as shown in FIG. 3B, when the symbol Sm2 is delayed with respect to the presumed sample timing in the signal S2, the amplitude of the signal S2 at the time "3T/4" becomes an amplitude $A_4$ which is smaller than the amplitude $A_3$.

Also, as shown in FIG. 3C, when the symbol Sm2 is advanced with respect to the presumed sample timing in the signal S2, the amplitude of the signal S2 at the time "3T/4" becomes an amplitude $A_5$ which is larger than the amplitude $A_3$.

In the timing error detection circuit 13, a timing error signal S13 of the signal S2 is generated by using the characteristics shown in FIGS. 3A to 3C.

Specifically, the timing error detection circuit 13 samples the signal S2 at a sample rate of the four times of the symbol rate. As a result, in the example shown in FIG. 3, sampling is performed at times "0", "T/4", "T/2" "3T/4" and "T".

Then the timing error detection circuit 13 compares the amplitude A(T/4) of the signal S2 sampled at the time "T/4" and the amplitude A(3T/4) of the signal S2 sampled at the time "3T/4", judges that the symbol is delayed with respect to the presumed sample timing in the signal S2 as shown in FIG. 3B when the amplitude A(T/4) is larger, and generates a timing error signal S13 indicating the judgement result and difference between the amplitude A(T/4) and the amplitude A(3T/4).

On the other hand, the timing error detection circuit 13 judges that the symbol is advanced with respect to the presumed sample timing in the signal S2 as shown in FIG. 3C when the amplitude A(3T/4) is larger as a result of comparison, and generates the timing error signal S13 indicating the judgement result and difference between the amplitude A(T/4) and the amplitude A(3T/4).

Figure 4:
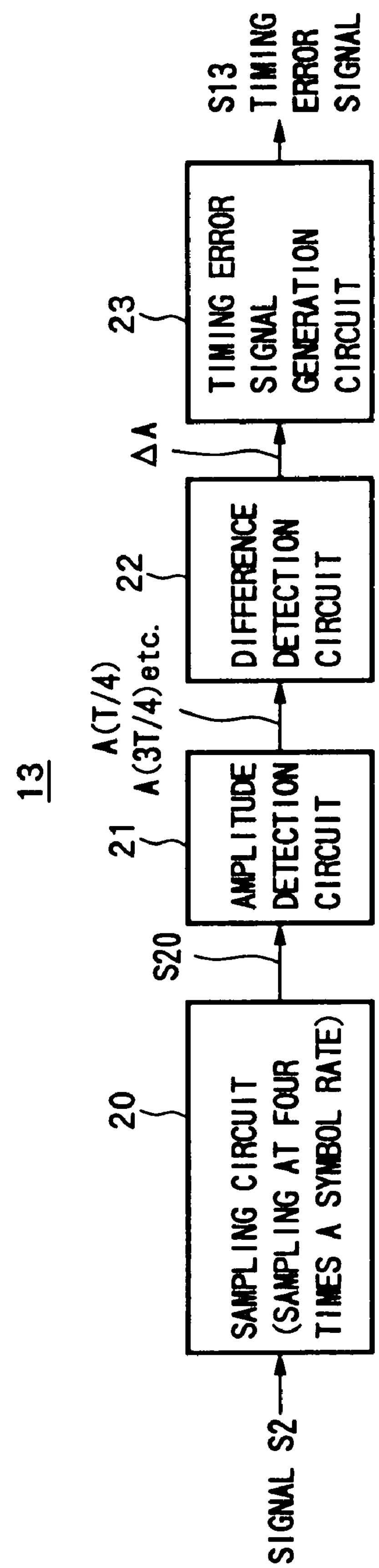
FIG. 4 is a view of the configuration of an example of the timing error detection circuit in FIG. 2.

FIG. 4 is a view of an example of the configuration of the timing error detection circuit 13.

As shown in FIG. 4, the timing error detection circuit 13 comprises a sampling circuit 20, amplitude detection circuit 21, difference detection circuit 22 and timing error signal generation circuit 23.

Here, the sampling circuit 20 corresponds to the sampling circuit of the present invention, the amplitude detection circuit 21 corresponds to the amplitude detection circuit of the present invention and the difference detection circuit 22 and the timing error signal generation circuit 23 corresponds to the detection circuit of the present invention.

The sampling circuit 20 generates a sampling signal S20 by sampling a signal S2 at a sample rate of the four times of the symbol rate. As a result, in the example shown in FIG. 3, a sampling signal S20 is generated by sampling the times "0", "T/4", "T/2", "3T/4" and "T".

The amplitude detection circuit 21 detects an amplitude of the sampling signal S20.

As a result, in the example shown in FIG. 3, for example, an amplitude A(T/4) of the signal S2 sampled at the time "T/4", an amplitude A(3T/4) of the signal S2 sampled at the time "3T/4", etc. are obtained.

The difference detection circuit 22 detects difference ΔA between the amplitude A(T/4) and the amplitude A(3T/4) detected in the amplitude detection circuit 21.

The timing error signal generation circuit 23 generates a timing error signal S13 based on the difference ΔA.

An operation of the symbol timing reproduction circuit 2 will be explained.

In the symbol timing reproduction circuit 2, a receiving signal S100 generated by being subjected to station selection processing and A/D conversion processing by a tuner after received by a parabolic antenna is input to a interpolation circuit 10.

In the interpolation circuit 10, the receiving signal S100 is sampled at a timing indicated by a sample timing determination signal S11 from the sample timing determination circuit 11, and a receiving signal S2 as a result thereof is output to the carrier reproduction circuit 102 shown in FIG. 1 and the timing error detection circuit 13 shown in FIG. 2.

In the timing error detection circuit 13, an amount and direction of deviation between the sample timing of the signal S2 and the presumed sample timing are detected and a timing error signal S13 indicating the two is generated. At this time, the generation of the timing error signal S13 in the timing error detection circuit 13 is performed, as explained above, without generating a phase signal.

The timing error signal S13 is removed noise components therein in the loop filter circuit 12 and a timing error signal S12 obtained thereby is output to the sample timing determination circuit 11.

The sample timing determination circuit 11 determines a new sample timing so as to eliminate or control the timing error detected in the timing error detection circuit 13 based on the timing error signal S12, and a sample timing determination signal S11 indicating the determined sample timing is output to the interpolation circuit 10.

As explained above, according to the symbol timing reproduction circuit 2, since a phase signal of the signal S2 is not generated at the time of generating a timing error signal S13 in the timing error detection circuit 13, it is possible to detect deviation of timing of a symbol in the signal S2 with a simple and small-scaled configuration.

Also, according to the symbol timing reproduction circuit 2, since only amplitude information is used at the time of detecting a timing error in the timing error detection circuit 13, it is possible to realize stable high speed synchronization for signals wherein carrier components remains.

Second Embodiment

A demodulation circuit of the present embodiment has the configuration shown in FIG. 1 in the same way as the above mentioned demodulation circuit 1 of the first embodiment and the symbol timing reproduction circuit has the configuration shown in FIG. 2 also in the same way as the above mentioned symbol timing reproduction circuit 2 of the first embodiment.

Note that in the demodulation circuit of the present embodiment, processing in the timing error detection circuit 13 shown in FIG. 2 is different from that described in the first embodiment.

Figure 5:
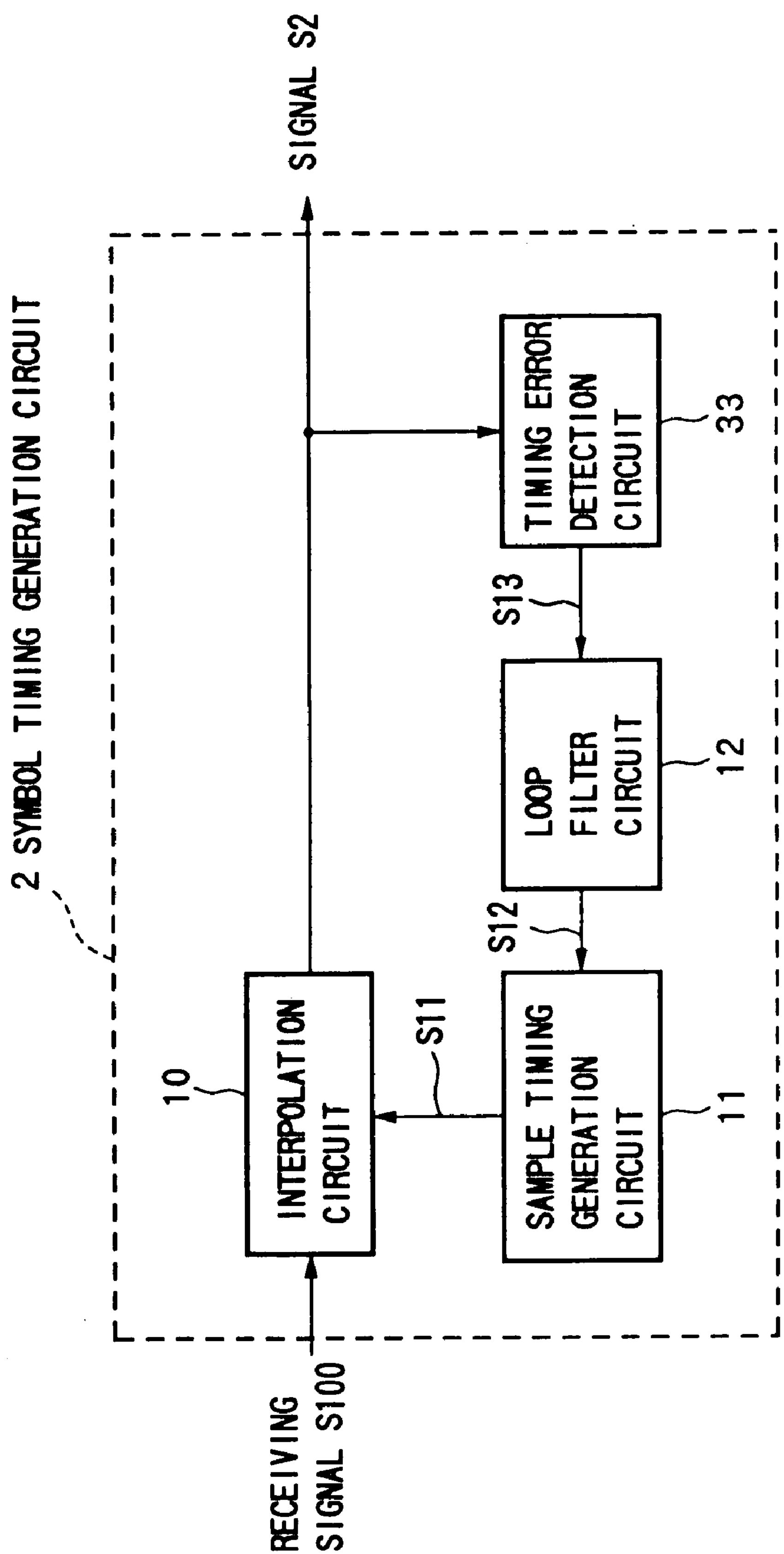
FIG. 5 is a view of the configuration of a symbol timing reproduction circuit of a demodulation circuit according to a second embodiment of the present invention.

FIG. 5 is a view of the configuration of the symbol timing reproduction circuit 32 used in the demodulation circuit of the present embodiment.

As shown in FIG. 5, the symbol timing reproduction circuit 32 comprises an interpolation circuit 10, a sample timing determination circuit 11, a loop filter circuit 12 and a timing error detection circuit 33.

Here, in FIG. 5, the interpolation circuit 10, sample timing determination circuit 11 and the loop filter circuit 12 having the same reference numbers are the same as those explained in the above mentioned first embodiment.

Namely, in the present embodiment, the timing error detection circuit is characterized.

The demodulation circuit of the present embodiment corresponds to a demodulation circuit in claim 7 and 11, wherein the symbol timing generation circuit 2 corresponds to the symbol timing reproduction circuit of the present invention, the carrier reproduction circuit 102 corresponds to the carrier reproduction circuit, and the symbol decode circuit 10.3 corresponds to the symbol decode circuit of the present invention.

Below, the timing error detection circuit 33 will be explained.

In the timing error detection circuit 13 in the above first embodiment, an example of sampling at the four times of the symbol rate was explained, while in the timing error detection circuit 33 of the present embodiment, sampling at the double of the symbol rate is performed and an amplitude A(T/4) and A(3T/4) shown in FIG. 3 are generated by performing interpolation processing.

Figure 6A:
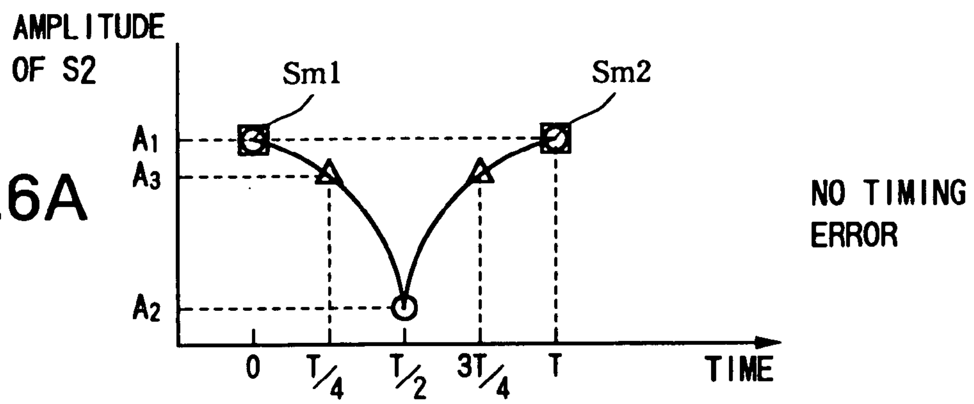
FIGS. 6A to 6C are views for explaining processing of the timing error detection circuit in FIG. 5.

Specifically, the timing error detection circuit 33 samples the signal S2 at the double of the symbol rate to obtain data D(0), D(T/2) and D(T) at times "0", "T/2" and "T" in the example shown in FIG. 6.

The timing error detection circuit 33 performs interpolation processing by using the data D(0) and D(T/2) to obtain data D(T/4) at the time "T/4".

Also, the timing error detection circuit 33 performs interpolation processing by using the data S(T/2) and D(T) to obtain data D(3T/4) at the time "3T/4".

Figure 6B:
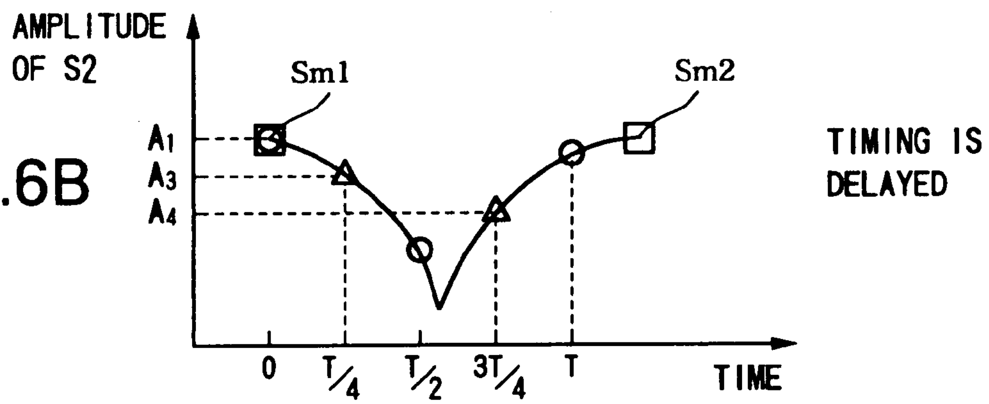

The timing error detection circuit 33 compares an amplitude A(T/4) of the data D(T/4) of the signal S2 at the time "T/4" obtained by interpolation processing with an amplitude A(3T/4) of the data D(3T/4) of the signal S2 at the time "3T/4" obtained by the interpolation processing, judges that the symbol is delayed with respect to the presumed sample timing in the signal S2 as shown in FIG. 6B when the amplitude A(T/4) is larger, and generates a timing error signal S13 indicating the judgement result and difference between the amplitude A(T/4) and the amplitude A(3T/4).

Figure 6C:
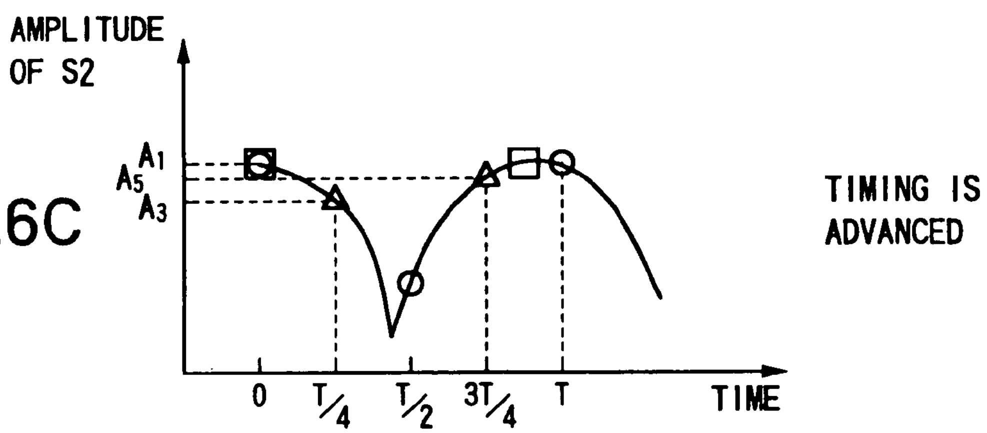

On the other hand, the timing error detection circuit 33 judges that the symbol is advanced with respect to the presumed sample timing in the signal S2 as shown in FIG. 6C when the amplitude A(3T/4) is larger as a result of the above comparison, and generates a timing error signal indicating the judgement result and difference between the amplitude A(T/4) and the amplitude A(3T/4).

Figure 7:
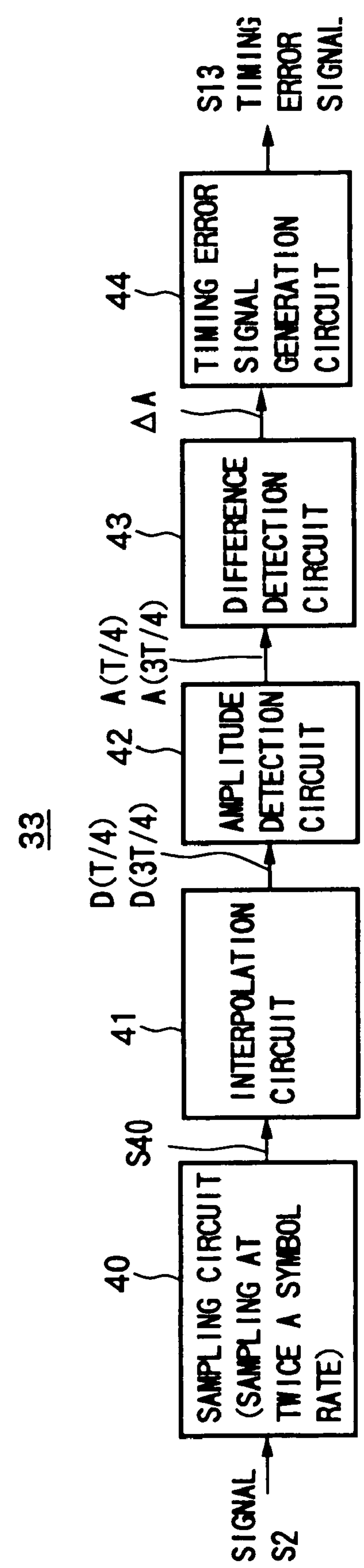
FIG. 7 is a view of the configuration of an example of the timing error detection circuit in FIG. 5.

FIG. 7 is a view of an example of the configuration of the timing error detection circuit 33.

As shown in FIG. 4, the timing error detection circuit 13 comprises a sampling circuit 40, an interpolation circuit 41, an amplitude detection circuit 42, a difference detection circuit 43 and a timing error signal generation circuit 44.

Here, the sample timing determination circuit 40 corresponds to the sampling circuit of the present invention, the interpolation circuit 42 corresponds to the first interpolation circuit of the present invention, the amplitude detection circuit 41 corresponds to the amplitude detection circuit of the present invention and the difference detection circuit 43 and the timing error signal generation circuit 44 corresponds to the detection circuit of the present embodiment.

The sampling circuit 40 generates a sampling signal S40 by sampling the signal S2 at a sample rate of the double of the symbol rate. As a result, in the example shown in FIG. 6, a sampling signal S40 obtained by sampling the times "0", "T/2" and "T" is generated.

The interpolation circuit 41 performs interpolation processing by using data D(0) of the signal S2 sampled at the time "0", data D(T/2) of the signal S2 sampled at the time "T/2", data D(T) of the signal S2 sampled at the time "T", etc. to obtain data D(T/4) at the time "T/4".

Also, the interpolation circuit 41 performs interpolation processing by using the data D(T/2) and D(T) to obtain data D(3T/4) at the time "3T/4".

The amplitude detection circuit 42 detects an amplitude in accordance with data generated in the interpolation circuit 41.

Specifically, the amplitude detection circuit 42 obtains an amplitude A(T/4) and A(3T/4) in accordance with the data D(T/4) and (3T/4).

The difference detection circuit 43 detects difference ΔA between the amplitude A(T/4) and the amplitude A(3T/4) obtained in the amplitude detection circuit 41.

The timing error signal generation circuit 44 generates a timing error signal S13 based on the difference ΔA.

Figure 8:
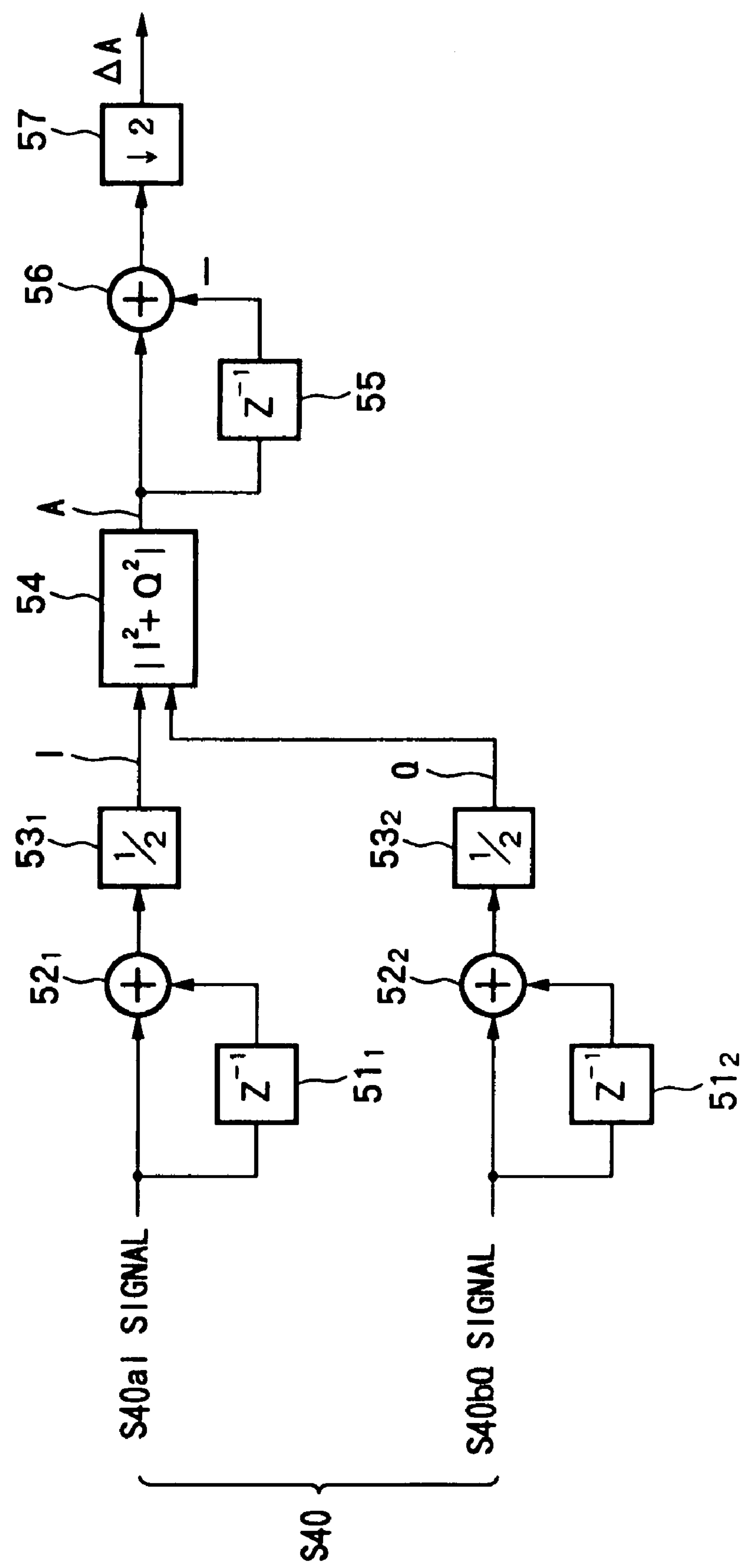
FIG. 8 is a circuit diagram of an embodiment of an amplitude detection circuit, interpolation circuit and difference detection circuit in FIG. 7.

FIG. 8 is a view of the configuration of a circuit 50 as an embodiment of the interpolation circuit 51, the amplitude detection circuit 42 and the difference detection circuit 43 shown in FIG. 7.

In the circuit 50, processing is performed on an I signal S40*a* and Q signal S40*b* of the sampling signal S40 sampled at the twice the symbol rate in the sampling circuit 40.

In an adding circuit 521, present sampling data of the I signal S40*a* and sampling data of the I signal S40*a* before that by one sample from the delay circuit 511 are added, the added result is multiplied with ½ in a shift circuit $\mathbf{53}_1$ and a signal I as a result thereof is output to a calculation circuit 54.

In parallel with the above, present sampling data of the Q signal S40*b* and sampling data of the Q signal S40*b* before one sample from the delay circuit 512 are added, the added result is multiplied with ½ in the shift circuit 532 and a signal Q as a result thereof is output to the calculation circuit 54.

In the calculation circuit 54, calculation equivalent of $|I^2+Q^2|$ is operated by using the signal I and the signal Q, and a signal S as an amplitude of the signal S40 is generated.

Here, the signal S indicates an amplitude (T/4) at the time "T/4" and an amplitude (3T/4) at the time "3T/4" in FIG. 6 in order.

Next, in a subtraction circuit 56, the signal S from the calculation circuit 54 is subtracted by the signal before one sample from the delay circuit 55 to generate a signal S56.

Then, in a selection circuit 57, one of a value obtained by subtracting the amplitude (3T/4) from the amplitude (T/4) and a value obtained by subtracting the amplitude (T/4) from the amplitude (3T/4) is selected and the selected value is output as a difference ΔA to the timing error signal generation circuit 44 shown in FIG. 7.

According to the above timing error detection circuit 33, as shown in FIG. 7, sampling in the sampling circuit 40 can be made the double of the symbol rate by providing the interpolation circuit 42.

As a result, the timing error detection circuit 33 can be made widely smaller comparing with the timing error detection circuit 13 of the first embodiment and power consumption can be reduced.

Third Embodiment

Below, an receiving apparatus according to the embodiments of the present invention will be explained.

FIG. 9 is a view of the configuration of a receiving apparatus 90 of the present embodiment.

The receiving apparatus 90 uses a Frequency Division Multiple Access (FDMA), such as a Single Channel Per Carrier (SCPC) mode, and receives a signal subjected to phase shift modulation, such as Binary Phase Shift Keying (BPSK) and Quadrature Phase Shift Keying (QPSK), via a satellite relay device, and is used in a receiving apparatus for demodulating a receiving signal, etc.

As shown in FIG. 9, the receiving apparatus 90 comprises, for example, an input terminal 110, a partial oscillation circuit 111, a same phase detection circuit 112, a phase shift circuit 113, a quadrature detection circuit 114, analog amplifying circuits 115 and 116, LPF circuits 118 and 119, A/D conversion circuit 120 and 121, an oscillation circuit 122, interpolation circuits 118 and 119, A/D conversion circuits 120 and 121, an oscillator 122, interpolation circuits 101 and 102, a complex multiplying circuit 130, roll-off filter circuits 131 and 132, a phase detection circuit 133, loop filter circuit 134, value controlled oscillation circuit 135, signal conversion circuits 136 and 137, symbol decode circuit 103, sample timing determination circuit 11, loop filter circuit 12, timing error detection circuit 13, an Automatic Gain Control (AGC) circuit 147, a PWM signal generation circuit 148 and a low-pass filter 149.

Here, the symbol timing reproduction circuit 146 is constituted by the interpolation circuits 10*a* and 102, sample timing determination circuit 11, loop filter circuit 12 and timing error detection circuit 13.

The sample timing determination circuit 11, loop filter circuit 12 and timing error detection circuit 13 are the same as the components having the same reference numbers shown in FIG. 2 explained in the first embodiment and perform processing on an I signal S120 and a Q signal S121.

The interpolation circuits $\mathbf{10}_1$ and $\mathbf{10}_2$ corresponds to the interpolation circuit 10 shown in FIG. 2 and performs processing on an I signal S120 and Q signal S121.

The partial oscillation circuit 111 generates a partial oscillation signal S111 having an intermediate frequency to be a carrier of a receiving signal S110 and outputs the same to the same phase detection circuit 112 and phase shift circuit 113.

The same phase detection circuit 112 detects same phase components of the carrier by multiplying the partial oscillation signal S111 with the receiving signal S110 having an intermediate frequency input from input terminal 110 and subjected to QPSK modulation to generate an I signal S112 of a baseband and outputs the same to the analog amplifying circuit 115.

The phase shift circuit 113 generates the partial oscillation signal S113 by shifting a phase of the partial oscillation signal S111 from the partial oscillation circuit 111 by 90 degrees and outputs the same to the quadrature detection circuit 114.

The quadrature detection circuit 114 detects quadrature components of the carrier by multiplying the partial oscillation signal S113 with the receiving signal S110 input from the input terminal 110 and subjected to QPSK modulation to generate a Q signal S114 of base band and outputs the same to the analog amplifying circuit 116.

The analog amplifying circuit 115 amplifies the I signal S112, generates an I signal S115 based on an amplifying rate control signal S149 from the LPF circuit 149 and outputs the same to the LPF circuit 118.

The analog amplifying circuit 116 amplifies the Q signal S114, generates a Q signal S116 based on an amplifying rate control signal S149 from the LPF circuit 149 and outputs the same to the LPF circuit 119.

The LPF circuit 118 removes high range components of the I signal S115 to generate an I signal S118 and outputs the same to the A/D conversion circuit 120.

The LPF circuit 119 removes high range components of the Q signal S116 to generate a Q signal S119 and outputs the same to the A/D conversion circuit 121.

The oscillation circuit 122 generates an oscillation signal S122 having a same frequency as a predetermined sampling frequency and outputs the same to the A/D conversion circuits 120 and 121.

Here, the sampling frequency is made larger than double of the symbol rate Rs for a convenience of symbol timing reproduction (carrier reproduction).

The A/D conversion circuit 120 performs A/D conversion on the I signal S118 based on the oscillation signal S122 from the oscillation circuit 122 to generate an I signal S120 in digital and outputs the same to the interpolation circuit $\mathbf{10_1}$.

The A/D conversion circuit 121 performs A/D conversion on the Q signal S119 based on the oscillation signal S122 from the oscillation circuit 122 to generates a Q signal S121 in digital and outputs the same to the interpolation circuit $\mathbf{10_2}$.

The interpolation circuit $\mathbf{10_1}$ performs interpolation processing on the I signal S123 based on the sample timing determination signal S11 from the sample timing determination circuit 11 to generate an I signal $\mathbf{S10_1}$ so that the symbol decode circuit 45 can judge a symbol at an appropriate timing.

The interpolation circuit $\mathbf{10_2}$ performs interpolation processing on the Q signal S124 based on the sample timing determination signal S11 from the sample timing determination circuit 11 to generate a Q signal $\mathbf{S10_2}$ so that the symbol decode circuit 45 can judge a symbol at an appropriate timing.

The complex multiplying circuit 130 uses the signals S136 and S137 for carrier reproduction (for frequency drawing and phase synchronization) from the signal conversion circuits 136 and 137 to perform frequency drawing processing and phase synchronization processing on the I signal S101 and Q signal S102 and generates an I signal S130*a* and Q signal S130*b* based on the formula (2) below.

$$\begin{matrix} I' & (S130a) \\ Q' & (S130b) \end{matrix} = \begin{pmatrix} \cos\omega t & -\sin\omega t \\ \sin\omega t & \cos\omega t \end{pmatrix} \begin{pmatrix} I & (S10_1) \\ Q & (S10_2) \end{pmatrix} \quad (2)$$

The roll-off filter circuit 131 performs filtering processing for reducing interferences between codes on the I signal S130*a* to generate an I signal S131 and outputs the same to the phase detection circuit 133, symbol decode circuit 103, timing error detection circuit 13 and AGC circuit 147.

The roll-off filter circuit 132 performs filtering processing for reducing interferences between codes on the Q signal S130*b* to generate a Q signal S132 and outputs the same to the phase detection circuit 133, symbol decode circuit 103, timing error detection circuit 13 and AGC circuit 147.

Note that in the present embodiment, a case of configuring the roll-off filter circuits 131 and 132 in the costas loop 155 was described as an example but they may be arranged immediately after the interpolation circuits $\mathbf{10_1}$ and $\mathbf{10_2}$.

The phase detection circuit 133 detects a phase determined by the I signal S131 and Q signal S132 and outputs a phase signal S133 indicating the phase to the loop filter circuit 134.

The loop filter circuit 134 removes high range components of the phase signal S133 to generate a phase signal S134 and outputs the same to the value controlled oscillation circuit 135.

The value controlled oscillation circuit 135 is a cumulative adder circuit not prohibiting overflowing, which performs adding operation up to the dynamic range in accordance with the phase signal S134 and becomes an oscillation state, generates a signal S135 having an oscillation frequency in accordance with the phase signal S134 and outputs the same to the signal conversion circuits 136 and 137. Namely, the value controlled oscillation circuit 135 performs in digital the same operation as that of the voltage controlled oscillation circuit (VCO) in an analog circuit.

The signal conversion circuit 136 comprises a ROM wherein, for example, a signal of 8-bit resolution having SIN characteristics and outputs a signal S136 having SIN characteristics read from the ROM in accordance with the signal S135 from the value controlled oscillation circuit 135 to the complex multiplying circuit 130.

The signal conversion circuit 137 comprises a ROM wherein, for example, a signal of 8-bit resolution having COS characteristics and outputs a signal S137 having COS characteristics read from the ROM in accordance with the signal S135 from the value controlled oscillation circuit 135 to the complex multiplying circuit 130.

Here, the costas loop circuit 155 comprises the complex multiplying circuit 130, roll-off filter circuits 131 and 132, phase detection circuit 133, loop filter circuit 134, value controlled oscillation circuit 135 and signal conversion circuits 136 and 137.

The symbol decode circuit 103 is the same as that explained in the first embodiment explained above and performs decoding processing for converting by using a predetermined correspondence table on symbols of the I signal S131 and Q signal S132 input from the roll-off filter circuits 131 and 132.

The symbol decode circuit 103 outputs results of the decoding processing to the error correction circuit in the following stage.

The timing error detection circuit 13 has the configuration shown in FIG. 4, performs processing by using the I signal S131 and Q signal S132 by the method explained with reference to FIG. 3 and generates a timing error signal S13.

The loop filter circuit 12 removes noise components from the timing error signal S13 input from the timing error detection circuit 13 to generate a timing error signal S12 and outputs the same to the sample timing determination circuit 11.

The sample timing determination circuit 11 determines a new timing so as to eliminate or suppress the timing error detected in the timing error detection circuit 13 based on the timing error signal S12 input from the loop filter circuit 12 and outputs a sample timing determination signal S11 indicating the determined sample timing to the interpolation circuits 101 and 102.

The AGC circuit 147 generates an amplification rate control signal S147 of for example 8-bit resolution for controlling the amplification rates of analog amplifiers 115 and 116 by using amplifying values of the I signal S131 and Q signal S132*a* so as to perform processing by using a stable appropriate amplitude in circuits in the latter stage of the A/D conversion circuits 120 and 121 and outputs the same to the PWM signal generation circuit 148.

The PWM signal generation circuit 148 converts an amplification rate control signal S147 in digital to an amplification rate control signal S148 as a PWM signal for obtaining an analog signal and outputs the same to the low-pass filter 149.

The low-pass filter 149 removes high range components of the amplification rate control signal S148 to generate an amplification control signal S149 in analog and outputs the same to the analog amplification circuits 115 and 116.

Below, an operation of the receiving apparatus 90 will be explained.

Same phase components in the receiving signal S110 received via a satellite relay device is detected by using a partial oscillation signal S111 in the same phase detection circuit 112, and an I signal S112 of baseband is generated.

At the same time, quadrature components of the receiving signal S110 is detected in the quadrature detection circuit 114 by using a partial oscillation signal S113 having a phase difference of 90 degrees with respect to a partial oscillation signal S111 and a Q signal S114 of a baseband is generated.

An I signal S115 is generated from the I signal S112 by amplifying processing based on the amplification rate control signal S149 in the analog amplifying circuit 115.

An I signal S120 is generated from the I signal S115 by being subjected to LPF processing in the LPF circuit 118 and A/D conversion processing in the A/D conversion circuit 120.

Next, interpolation processing is performed on the I signal S123 based on the sample timing determination signal S11 from the sample timing determination circuit 11 to generate an I signal S10$_1$ so that the symbol decode circuit 145 is capable of judging a symbol at an appropriate timing in the interpolation circuit 10$_1$.

Also, processing on the Q signal is performed in parallel with processing on the above mentioned I signal.

Namely, a Q signal S116 is generated from the Q signal S114 by amplifying processing based on the amplification rate control signal S149 in the analog amplification circuit 116.

A Q signal S121 is generated from the Q signal S116 by being subjected to LPF processing in the LPF circuit and A/D conversion processing in the A/D conversion processing.

Next, interpolation processing is performed on the Q signal S124 based on the sample timing determination signal S11 from the sample timing determination circuit 11 to generate a QI signal S10$_2$ so that the symbol decode circuit 145 is capable of judging a symbol at an appropriate timing in the interpolation circuit 10$_2$.

Then in the costas loop circuit 155, frequency drawing processing and phase synchronization processing is performed on the I signal S10$_1$ and Q signal S10$_2$.

In the procedure, the I signal S131 and Q signal S132 from the roll-off filter circuits 131 and 132 are output to the AGC circuit 147.

In the AGC circuit 147, an amplification rate control signal S147 in digital for controlling amplification rates of the amplifying circuits 115 and 116 are generated for example of 8-bit resolution.

The amplification rate control signal S147 in digital is converted to an amplification rate control signal S148 as a PWM signal for obtaining an analog signal in the PWM signal generation circuit 148 and output to the low-pass filter 149.

The amplification rate control signal S148 becomes an amplification rate control signal S149 when being removed high range components by the low-pass filter 149 and output to the amplifying circuits 115 and 116.

Also, in parallel with the above processing, a timing error signal S13 is generated by a method explained above with reference to FIG. 3 in the timing error detection circuit 13 based on the I signal S131 and Q signal S132 input to the timing error detection circuit 13 from the roll-off filter circuits 131 and 132 and subjected to carrier reproduction.

The timing error signal S13 is removed noise components therein in the loop filter circuit 12 and output as a timing error signal S12 to the sample timing determination circuit 11.

In the sample timing determination circuit 11, a new sample timing is determined so as to eliminate or suppress a timing error detected in the timing error detection circuit 13 based on the timing error signal S12 in the sample timing determination circuit 11, and a sample timing determination signal S11 indicating the determined sample timing is output to the interpolation circuits 10$_1$ and 10$_2$.

As explained above, according to the receiving apparatus 90, by using a symbol timing reproduction circuit 146 having approximately the same configuration with that of the symbol timing reproduction circuit 2 explained in the first embodiment, only amplitude information is used at the time of generating the timing error signal S13 in the timing error detection circuit 13, thus, stable and high speed synchronization can be realized even for a signal wherein carrier components remain.

The present invention is not limited to the above embodiments.

For example, in the above mentioned receiving apparatus shown in FIG. 9, a case where the timing error detection circuit 13 explained in the first embodiment was used as a timing error detection circuit was described as an example, but the timing error detection circuit 33 explained in the second embodiment may be used, as well.

Also, in the above embodiments, a case where a signal was sampled at twice and fourth the symbol rate was explained as an example, but the present invention can be applied to a case of sampling at any frequency more than twice the symbol rate.

As explained above, according to the timing error detection circuit and demodulation circuit of the present invention, by detecting a timing error of a symbol by using an amplitude of a signal without using a phase signal, a small-sized circuit can be realized.

Also, according to a method of a timing error detection circuit and a method and a demodulation circuit, stable and high speed synchronization can be realized for a signal wherein carrier components remain.

While the invention has been described with reference to specific embodiment chosen for purpose of illustration, it should be apparent that numerous modifications could be made thereto by those skilled in the art without departing from the basic concept and scope of the invention.

What is claimed is:

1. A timing error detection circuit for detecting a timing error of symbols arranged at a predetermined symbol cycle T included in a signal, comprising:

a sampling circuit for sampling said signal at a frequency equal to four times of a symbol rate;

an amplitude detection circuit for detecting an amplitude at said sampled position in said signal; and a detection circuit for detecting a direction and amount of said timing error based on the large or small relationship and the difference of said detected amplitude at time "T/4" and the detected amplitude at time "3T/4" when assuming a symbol appears at times "0" and "T".

2. A timing error detection circuit as set forth in claim 1, wherein said signal is a phase shift modulated signal.

3. A timing error detection circuit for detecting a timing error of symbols arranged at a predetermined symbol cycle T included in a signal, comprising:

a sampling circuit for sampling at a frequency equal to double of a symbol rate;

an interpolation circuit for generating data at time "T/4" by using sampled data at time "0" and "T/2", and generating data at time "3T/4" by using said sampled data at time "T/2" and data on time "T" when assuming a symbol appears at times "0" and "T";

an amplitude detection circuit for detecting an amplitude of said signal at the position from data at said time "T/4" and time "3T/4"; and a detection circuit for detecting a direction and amount of said timing error based on the large or small relationship and the difference of the amplitude at said time "T/4" and the amplitude at said time "3T/4".

4. A timing error detection circuit as set forth in claim 3, wherein said signal is a phase shift modulated signal.

5. A demodulation circuit, comprising:

a symbol timing reproduction circuit for detecting a timing error of symbols arranged at a predetermined symbol cycle included in a signal and reproducing a symbol timing of said signal based on the detected timing error, a carrier reproduction circuit for performing carrier reproduction of the signal wherein said symbol timing is reproduced; and a symbol decode circuit for decoding said symbol included in said carrier reproduced signal:

and wherein:

said symbol timing reproduction circuit comprises:

a sampling circuit for sampling said signal at a frequency equal to four times of a symbol rate;

an amplitude detection circuit for detecting an amplitude at said sampled position in said signal;

a detection circuit for detecting a direction and amount of said timing error based on sizes and difference of said detected amplitude at time "T/4" and the detected amplitude at time "3T/4" when assuming a symbol appears at times "0" and "T"; and an interpolation circuit for reproducing the symbol timing by performing interpolation processing on said signal based on said detected timing error.

6. A demodulation circuit as set forth in claim 5, wherein said signal is a phase shift modulated signal.

7. A demodulation circuit, comprising:

a symbol timing reproduction circuit for detecting a timing error of symbols arranged at a predetermined symbol cycle included in a signal and reproducing a symbol a symbol timing of said signal based on the detected timing error;

a carrier reproduction circuit for performing carrier reproduction of the signal wherein said symbol timing was reproduced; and a symbol decode circuit for decoding said symbol included in said carrier reproduced signal;

and wherein:

said symbol timing reproduction circuit comprises:

a sampling circuit for sampling said signal at a frequency equal to double of a symbol rate;

a first interpolation circuit for generating data at time "T/4" by using said sampled data at time "0" and "T/2", and generating data at time "3T/4" by using said sampled data at time "T/2" and data at time "T" when assuming a symbol appears at times "0" and "T";

an amplitude detection circuit for detecting an amplitude of said signal at the position from data on said time "T/4" and data at said time "3T/4";

a detection circuit for detecting a direction and amount of said timing error based on the large or small relationship and the difference of an amplitude at said time "T/4" and an amplitude at said time "3T/4"; and a second interpolation circuit for reproducing a symbol timing by performing interpolation processing on said signal based on said detected timing error.

8. A demodulation circuit as set forth in claim 7, wherein said signal is a phase shift modulated signal.

9. A timing error detection method for detecting a timing error of symbols arranged at a predetermined symbol cycle T included in a signal, including the steps of:

sampling said signal at a frequency of four times a symbol rate;

detecting an amplitude at said sampled position in said signal; and detecting a direction and size of said timing error based on sizes and difference of said detected amplitude at time "T/4" and the detected amplitude at time "3T/4" when assuming a symbol appears at times "0" and "T".

10. A timing error detection method as set forth in claim 9, wherein said signal is a phase shift modulated signal.

11. A timing error detection method for detecting a timing error of symbols arranged at a predetermined symbol cycle T included in a signal, including the steps of:

sampling at a frequency equal to double of a symbol rate;

generating data at time "T/4" by using said sampled data at time "0" and data at time "T/2" when assuming a symbol appears at times "0" and "T";

generating data at time "3T/4" by using said sampled data at time "T/2" and data on time "T";

detecting an amplitude of said signal at the position from data at said time "T/4" and time "3T/4"; and detecting a direction and size of said timing error based on the large or small relationship and the difference of the amplitude at said time "T/4" and the amplitude at said time "3T/4".

12. A timing error detection method as set forth in claim 11, wherein said signal is a signal subjected to phase shift modulation.

13. A demodulation method, including the steps of:

sampling said signal including symbols arranged at a predetermined symbol cycle at a frequency equal to four times of a symbol rate;

detecting an amplitude at said sampled position in said signal;

detecting a direction and size of said timing error based on the large or small relationship and the difference of said detected amplitude at time "T/4" and said detected amplitude at time "3T/4" when assuming a symbol appears at times "0" and "T";

reproducing a symbol timing by performing interpolation processing on said signal based on said detected timing error;

performing carrier reproduction of the signal wherein said symbol timing is reproduced; and decoding said symbol included in said carrier reproduced signal.

14. A demodulation method as set forth in claim 13, wherein said signal is a phase shift modulated signal.

15. A demodulation method including the steps of:

sampling a signal including symbols arranged at a predetermined symbol cycle at a frequency equal to double of a symbol rate;

generating data at time "T/4" by using said sampled data at time "0" and data at time "T/2" when assuming a symbol appears at times "0" and "T";

generating data at time "3T/4" by using said sampled data at time "T/2" and data at time "T";

detecting an amplitude of said signal at the position from data at said time "T/4" and data at time "3T/4"; and detecting a direction and amount of said timing error based on the large and small relationship and difference of the amplitude of said time "T/4" and the amplitude at said time "3T/4";

reproducing the symbol timing by performing interpolation processing on said signal based on said detected timing error;

performing carrier reproduction of the signal wherein said symbol timing is reproduced; and decoding said symbol included in said carrier reproduced signal.

16. A demodulation method as set forth in claim 15, wherein said signal is a signal subjected to phase shift modulation.

* * * * *